United States Patent [19]

Yarborough et al.

[11] Patent Number: 4,652,817

[45] Date of Patent: Mar. 24, 1987

[54] ACOUSTO-OPTIC CHIP RATE DETECTOR

[75] Inventors: John R. Yarborough, Fremont; Dale F. Dickinson, Menlo Park, both of Calif.

[73] Assignee: Itek Corporation, Beverly Hills, Calif.

[21] Appl. No.: 701,405

[22] Filed: Feb. 14, 1985

[51] Int. Cl.$^4$ ............................................. G01R 23/16
[52] U.S. Cl. .................... 324/77 K; 350/356
[58] Field of Search ............... 350/356, 96.14; 372/12, 372/98; 324/77 K, 96

[56] References Cited

U.S. PATENT DOCUMENTS

| | | | |
|---|---|---|---|
| 2,797,619 | 7/1957 | Rosenthal | 324/77 K |
| 3,205,495 | 9/1965 | Wilmotte | 324/77 K |
| 3,573,449 | 4/1971 | Maloney | 324/77 K |
| 4,122,393 | 10/1978 | Gordy et al. | 325/324 |
| 4,163,205 | 7/1979 | Barron | 324/77 K |
| 4,247,939 | 1/1981 | Stromswold et al. | 375/1 |

OTHER PUBLICATIONS

Robert A. Scholtz, "The Spread Spectrum Concept, IEEE Transactions on Communications", vol. Com-25, No. 8, Aug. 1977, p. 748.
Raymond L. Pickholtz and Donald L. Schilling, "Theory of Spread Spectrum Communications-A Tutorial", IEEE Transactions on Communications, vol. COM-30, No. 5, May 1982, p. 855.
Roger D. Colvin, "Spread-Spectrum Devices Cater to New Systems", Microwaves Magazine, Feb. 1981.
"Spread Spectrum Communication-Myths and Realities", Andrew J. Viterbi, IEEE Communications Magazine, May 1979.
"Introduction to Spread Spectrum", Charles E. Cook and Howard S. Marsh, IEEE Communications Magazine, Mar. 1983.
"Spread Spectrum Systems Serve Nearly All C3 Aspects", Dr. C. Louis Cuccia, Microwave Systems News, Apr. 1982.
"Spread Spectrum Radios Thwart Hostile Jammers", Marc Spellman, Microwaves, Sep. 1981.
"Performance Criteria for Spread Spectrum Communication", Marlin P. Restenbatt, IEEE Transactions on Comm., Aug. 1977.
"Frequency Selective Propagation Effects on Spread-Spectrum Receiver Tracking", Robert L. Bogusch, et al., Proceedings IEEE, Jul. 1981.
"A New Class of Polyphase Pulse Compression Codes and Techniques", R. L. Lewis and F. F. Kretschmer, Jr., IEEE Transactions, on Aerospace and Electronics, May 1981.
"Concatenated Sequences for Spread Spectrum Systems", S. L. Maskara, and J. Das, IEEE Transactions on Aerospace and Electronics, May 1981.
"Pseudo-Random Code Waveform Design for CW Radar", D. F. Abanese, and A. M. Klein, IEEE Transactions on Aerospace and Electronics Systems, Jan. 1979.
"Ambiguity Processor Architectures Using One Dimensional Acousto-Optic Transducers", J. D. Cohen, SPIE, vol. 180, 1979.
"Characteristics of Acousto-Optic Devices for Signal Processors", I. C. Chang and D. L. Hecht, Optical Engineering, Jan./Feb. 1982.
"Interferometric Spectrum Analyzer", A. Vander Lugt, Applied Optics, Aug. 1981.
"Coherent Optical Processing", A. Vander Lugt, Proc. IEEE, Oct. 1984.
"Spectrum Analysis Using Optical Processing", Terry M. Turpin, Pros. IEEE, Jan. 1981.
"Acousto-Optic Signal Processing: Convolution and Correlation", W. T. Rhodes, Proc. IEEE, Jan. 1981.

*Primary Examiner*—Michael J. Tokar
*Attorney, Agent, or Firm*—Roy L. Brown

[57] ABSTRACT

Acousto-optical apparatus for determining the chip rate of a pseudo-random sequence of signals.

10 Claims, 17 Drawing Figures

TIME DOMAIN

FREQUENCY DOMAIN

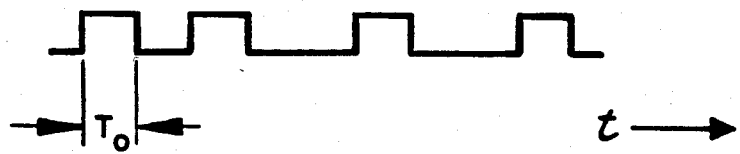
Fig_5A
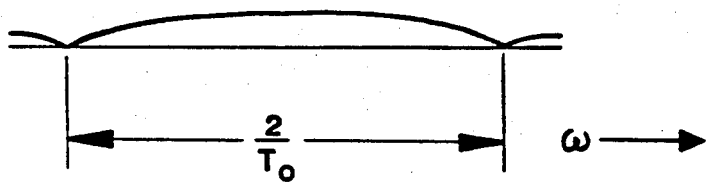
Fig_5B
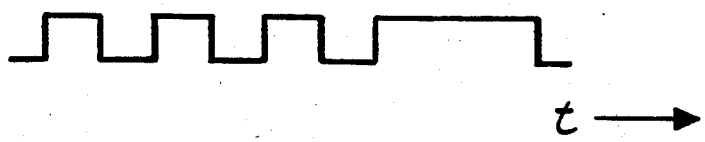
Fig_6A
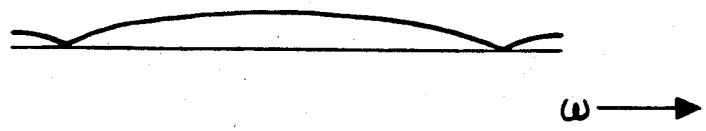
Fig_6B

ACOUSTO-OPTIC CHIP RATE DETECTOR

BACKGROUND OF THE INVENTION

1. Field of the Invention

This invention pertains to Acousto-optical Apparatus and Systems and to Means for Determining the Chip Rate of a Pseudo-Random Signal Sequence.

2. Description of Related Art

Acousto-Optic Apparatus for radio frequency spectrum analysis are described in Chapter 4, "Applications of Acousto-Optic Techniques to RF Spectrum Analysis", of the book, "Acousto-Optic Signal Processing Theory and Implementation", edited by Norman J. Berg and John M. Lee, published by Marcel Dekker, Inc., in 1983. Chapter 9 of the same book pertains to "Incoherent-Light Time-Integrating Processors", and Chapter 10 pertains to "Coherent Time-Integration Processors". Pages 303, 306, 320–321 discuss pseudo-random signals in connection with acousto-optic apparatus.

Briefly, in an acousto-optic spectrum analyzer, a laser light is transmitted through a Bragg Cell that is mechanically modulated by a radio frequency signal. The radio frequency signal, through a mechanical transducer such as a quartz crystal, delivers a mechanical wave to the Bragg Cell, and the mechanical wave modifies the index of refraction of the Bragg Cell so that the interaction between the laser light and the mechanical wave causes a deflection of the light as a function of the frequency of the radio frequency signal. The interaction may alternatively be characterized as the interaction between the photons of the laser light and the photons of the radio frequency sonic signal. The deflection is sensed by a row of photosensors, and the energizing of a particular photosensor signal is thereby a measure of the frequency of the radio frequency. In the presence of a plurality of radio frequency signals, the laser light has a plurality of deflected beams, and a plurality of sensors are energized, signifying the precences and frequencies of such plurality of radio frequency signals. Such simultaneous frequency measurement is important in identifying the frequency content of incoming radar signals, and the like.

Signal Interrogation systems are faced with the challenge of detecting and processing low-probability-of-intercept radar signals wherein the radar systems use spectrum spreading modulations to avoid interception. Theory and the current the state of the art information indicate that a processing gain on the order of 50 to 60 decibels may be experienced by an authorized receiver to which the spectrum spreading modulation code is known, whereby the radar can reduce the density of its effective radiated power by a like amount.

Thus, detecting such emission poses two significant problems: the signals must be hunted when none of their parameters are known; the signals must then be found when they are of extremely low intensity.

Frequently masked radio frequency or radar signals carrying information and data, including radar data, are encoded onto pseudo-random signals. It is important to unmask such signals and to decode them. An information signal, together with a pseudo-random signal may be carried by a radio frequency carrier, and it may appear to be noise.

Typically the data is digital data in the form of a binary bit train having a bit-period $T_1$, and a bit-frequency which is the reciprocal of $T_1$. Superimposed upon that information bit train is a pseudo-random bit train having a bit-period $T_c$, and a bit frequency called the "chip rate" which is the reciprocal of $T_c$. The term "chip rate" will be so-used herein.

When one knows the value of $T_c$, one can, by prior art means, extract both the carrier frequency and the encoded information from the pseudo-random background signal. When one does not know the chip rate $T_c$, one can sense the incoming signal, delay it by a time delay $\tau$ and multiply the delayed signal by the incoming signal. The product of the incoming signal and the delayed incoming signal is then integrated. If the signal contains a pseudo-random pulse train, and if the time delay $\tau = T_c$, the period of the chip rate, the radio frequency spectrum will display signal spikes at odd multiples of $\tau = T_c$ about the carrier frequency. However, if the purpose of the apparatus is to determine the value of $T_c$ of an incoming signal very rapidly, and particularly if the incoming signal is of short duration or is part of a radar signal, one would need a plurality of such circuits and integrators, each having a different time delay $\tau$. Further, the prior art procedures are very time consuming, and time is of the essense in a threat warning system.

SUMMARY OF THE INVENTION

The low probability of intercepting such masked pseudo-random signals with prior art devices can be overcome by using an acousto-optic signal processor with its inherently wide bandwidth and high degree of parallelism.

The apparatus contemplated by this invention utilizes two Bragg cells wherein a laser light shines consecutively through the two cells, and the incoming radio frequency signal is channeled in parallel to both Bragg cells. In the light path between the Bragg cells, the laser light is spread into multiple parallel beams in one dimension, and an optical prism is used as a time delay which varies along that dimension. For each parallel beam there will be a time delay $\tau = T_c$ corresponding to a particular position along that spread dimension. The delayed beams modulated by the input signal are focused onto the second Bragg cell where they are multiplied by the incoming signal. The multiplied signal is again spread along a second dimension, and the spread spectrum of the frequency contains intensity spikes at frequencies corresponding to an odd number of multiples of the chip frequency around the radio frequency carrier frequency.

It is therefore an object of this invention to obtain the chip frequency of pseudo-random radio frequency sequences.

More particularly, it is an object of this invention to use acousto-optic apparatus for obtaining chip rates of a plurality of simultaneously-received pseudo-random radio frequency sequences.

Other objects will become apparent from the following description, taken together with the accompanying drawings.

BRIEF DESCRIPTION OF THE DRAWINGS

FIG. 5A is a graph in the time domain of a binary pseudo-random sequence.

FIG. 5B is a graph in the frequency domain, w, corresponding to the signal of FIG. 5A.

FIG. 6A is a graph in the time domain of the combined signals of FIGS. 4A and 5A wherein a "one" appears when the two signals are alike.

FIG. 6B is a graph in the frequency domain, w, corresponding to the signal of FIG. 6A.

DETAILED DESCRIPTION OF THE INVENTION

Figure 1:
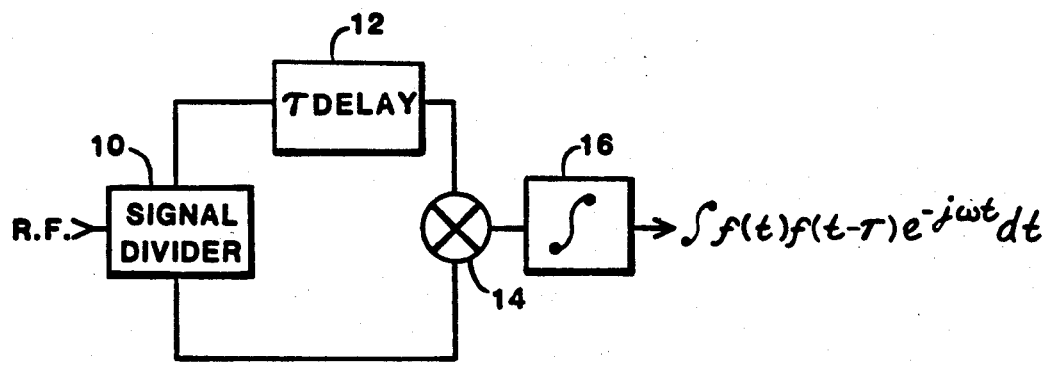
FIG. 1 is a prior-art electronic apparatus for determining the chip rate of incoming radio frequency pseudo-random pulses.
Figure 7:
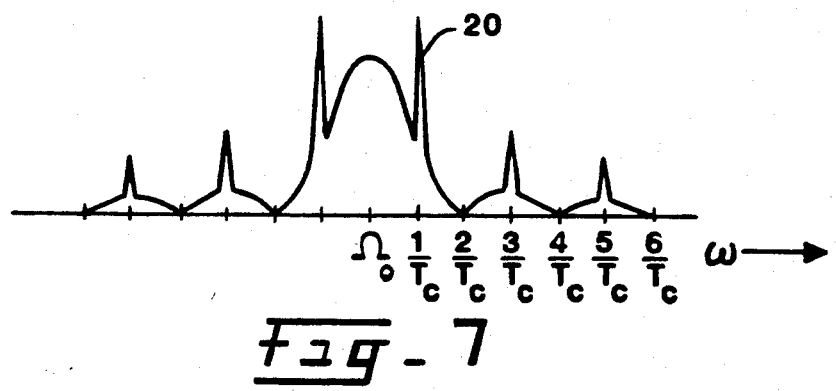
FIG. 7 is a graph in the frequency domain, w, of the output of the circuit shown in FIG. 1 when $\tau = T_c$, centered around the carrier frequency, $\Omega_o$.
Figure 8A:
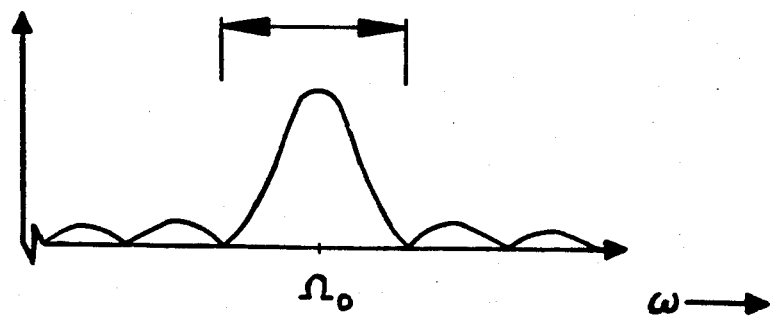
FIG. 8A is a graph, in the frequency domain, w, of an input signal carrying a pseudo-random signal.
Figure 8B:
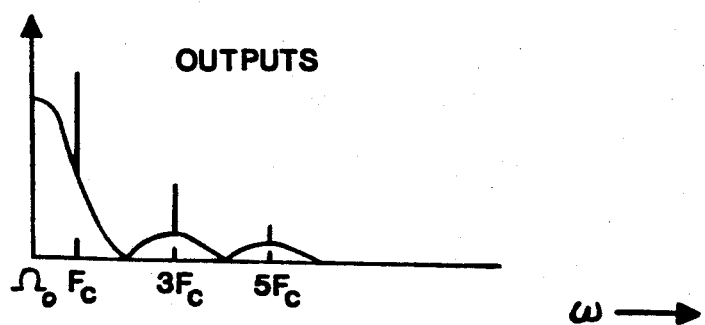
FIG. 8B is a graph of an output signal in the frequency domain, w, of the output of the apparatus of this invention having the input signal of FIG. 8A.
Figure 9A:
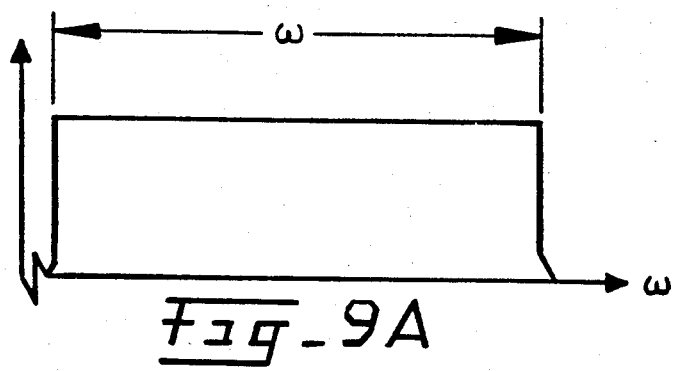
FIG. 9A is a graph in the frequency domain, w, of a band limited white noise signal.
Figure 9B:
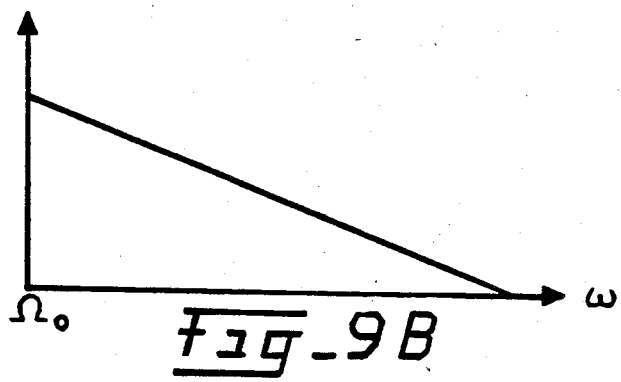
FIG. 9B is a graph of an output signal in the frequency domain, w, of the output of the apparatus of this invention having the input signal of FIG. 9A.
Figure 10A:
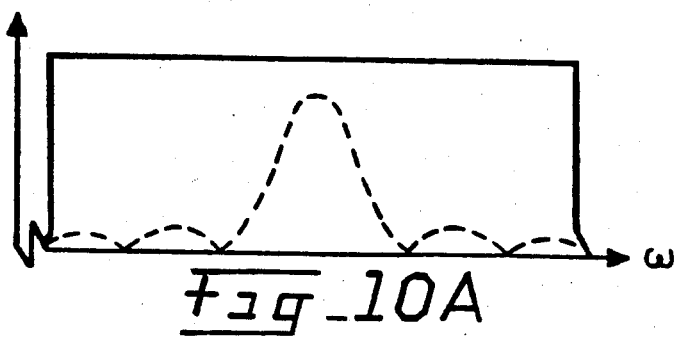
FIG. 10A is a graph, in the frequency domain, w, of the signal of FIG. 8A with the noise of FIG. 9A covering the signal.
Figure 10B:
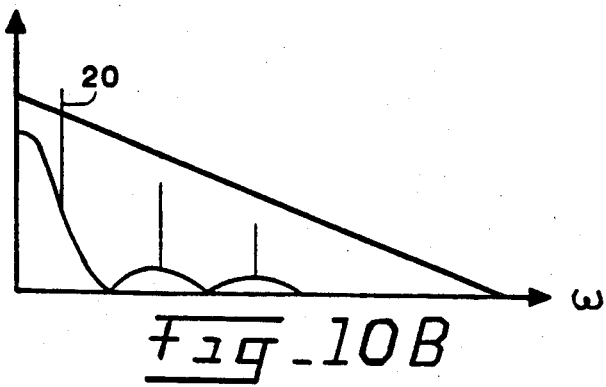
FIG. 10B is a graph, in the frequency domain, w, of the output of the apparatus of this invention having the input signal of FIG. 10A.

In the prior art, the circuit of FIG. 1 is used to find the chip rate of a pseudo-random sequence. The incoming signal is delivered to a signal divider 10 which delivers the signal both to a time delay apparatus 12 and to a signal multiplying apparatus 14. The output of the time delay apparatus 12 is delivered to the signal multiplying apparatus 14 where it is multiplied by the signal from the divider 10. The output of the signal multiplying apparatus 14 is delivered to an integrator 16 where it is integrated. When the period of the time delay apparatus 12 is equal to the period of the chip rate, a clearly identifiable spike 20 (FIGS. 7, 8B and 10B) occurs. To determine the chip rate of an incoming signal, the time delay would need to be varied until the spike 20 appeared.

Figure 2A:
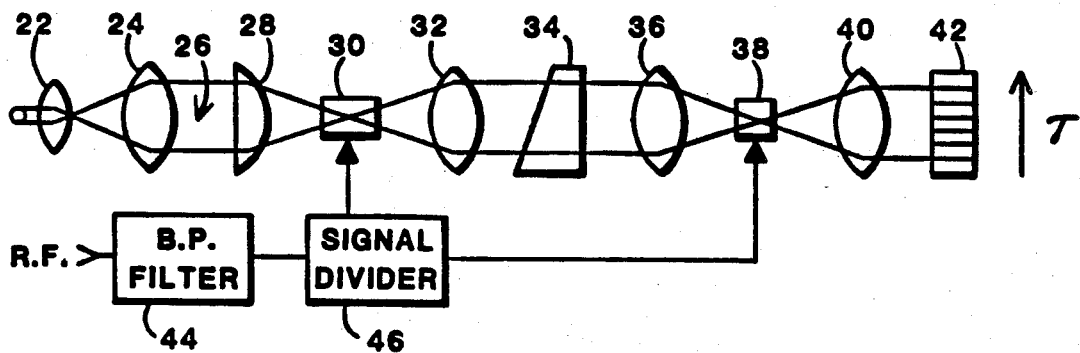
FIG. 2A is a schematic diagram of the apparatus of this invention with the $\tau$ direction in profile.
Figure 2B:
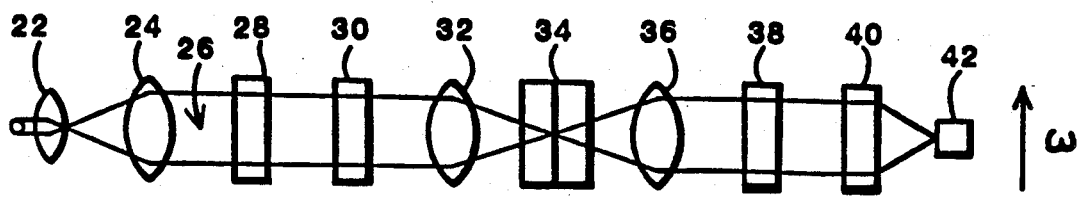
FIG. 2B is a schematic diagram of the apparatus of this invention with the w, or frequency, direction in profile.

The apparatus of this invention is shown in FIGS. 2A and 2B. A coherent light, typically from a laser (not shown) is delivered through a lens system 22, 24. The lens system 22, 24 spreads out the light into a circular substantially uniform light intensity field. Typically light from a laser is a relatively small beam, but if it should be adequately large, obviously the lens system 22, 24 would not be needed. Further, if the light were a very large beam, a different lens system (not shown) could be use to reduce the size of the light beam. The light rays from the lens system 22, 24 are parallel. The parallel light beams 26 are delivered through a focussing lens 28 to a first Bragg Cell 30. The lens 28 is typically a cylindrical lens which converges the light rays 26 in the first dimension, shown in FIG. 2A, while leaving them parallel in a second dimension, shown in FIG. 2B, perpendicular to the first dimension. As shown in FIG. 2A, the lens 32 re-collimates the output light from the Bragg Cell 30 in the first dimension while, as shown in FIG. 2B, it simultaneously converges the light in the second dimension. The light then is transmitted through a prism 34 which has a thickness in the direction of the light that varies in the first or $\tau$ dimension. Light from the prism 34 is focused by lens 36, as shown in FIG. 2A, in the first dimension on the second Bragg Cell 38 and simultaneously collimated by the lens 36, as shown in FIG. 3B, in the second dimension. The light from Bragg Cell 38 is re-collimated by the lens 40 in the first dimension, as shown in FIG. 2A, and focussed on the line of detectors 42 in the second dimension, as shown in FIG. 2B.

The radio frequency signal to the analyzed is delivered through a bandpass filter 44, thence through a signal divider 46 to the two Bragg Cells 30, 38, as shown in FIG. 2A.

The optics system 22, 24, 28 focusses the incident substantially planar light onto the Bragg Cell 30. Bragg Cell 30 modulates the light with the input radio frequency signal through the Bragg acousto-optic interaction. A number of parallel light beams are generated in the first dimension. As shown in FIG. 2A, the lens 32 re-collimates the output light from the Bragg Cell 30 in the first dimension while, as shown in FIG. 2B, it simultaneously converges the light in the second dimension. The light then is transmitted through a prism 34 which has a thickness in the direction of the light that varies in the first or $\tau$ dimension. The light from prism 34 is a multitude of beams with different associated delay values. Light from the prism 34 is focussed by lens 36, as shown in FIG. 2A, in the first dimension on the second Bragg Cell 38 and simultaneously collimated by the lens 36, as shown in FIG. 2B, in the second dimension. Although the multitude of beams with differing time delay values are focussed together and passed through Bragg cell 38, no destructive interference is created between the beams, i.e. no intermodulation is experienced between the beams. The light from Bragg Cell 38 is re-collimated by the lens 40 in the first dimension, as shown in FIG. 2A, and focussed on the line of detectors 42 in the second dimension, as shown in FIG. 2B.

The radio frequency signal to be analyzed is delivered through a bandpass filter 44, thence through a signal divider 46 to the two Bragg Cells 30, 38, as shown in FIG. 2A.

The apparatus of the invention uses the parallel processing characteristics of optical processors to combine, in a single device, the processing capability of a large number of conventional electronic chip rate detectors.

As shown in FIG. 2A, the lens system 22, 24, 28 focusses the incident light onto Bragg Cell 30. Both Bragg Cells 30 and 38 receive the radio frequency input from the divider 46. Bragg Cell 30 modulates the incident light wave by Bragg acousto-optic interaction. A number (N) of parallel light beams, all with the same modulation, are produced by the Bragg interaction, at Bragg Cell 30, between the light photons and the radio frequency sound phonons. The N channels are collimated and passed through a variable delay unit, prism 34. The wedge-shape of prism 34 produces a misregistration of the incident parallel light channels. After each parallel channel is inverse Fourier transformed by lens 36, the misregistration produced by the prism 34 translates to a different time delay value. Lens 36 also collects and images the N channels or beams of light onto Bragg Cell 38. The parallel (N) light channels exiting Bragg Cell 38, because of the non-delayed radio frequency audio input thereto, are the product of the (N) delayed signals and the undelayed signal. Because the output detector 42 has discrete channels, the unique delay of each of the N channels can be represented as an output signal from a specific one of the detectors of the detector set 42.

After the N parallel channels are produced with varying values of $\tau$, the lens 40 completes the system by performing the Fourier transform such that the signals delivered to the detector 42 are measures of the power spectrum of each individual one of the N channels. In the plane of the output detector 42, FIG. 2B shows the chipping or frequency axis of the input radio signal, and FIG. 2A shows the axis of the different values of $\tau$. An input signal with a chipping sequence generates a strong spectral output on one of the detectors of the line of detectors 42. Adjacent signals have some energy, but the peak is on the signal where the equivalent delay is half a chip period. Location of the peak energy along the $\tau$ axis is indicative of the frequency position the signal assumes in the system passband.

A post-processor (not shown) can be used to filter out noise and weak signals.

Typically the radiation delivered to the Bragg cells is visible light, but it is within the concept of this invention that the radiation could be infra-red or ultra-violet radiation.

Further, although the mechanical frequencies at which the Bragg cells are driven are typically in the range of hundreds of megahertz, it is within the concept of this invention that lower or higher frequencies may be used. The lower bound on the frequency is that which produces a negligible effect within the Bragg cell.

The prism 34, as shown, is perpendicular to the light beams on its right boundary but is a ramp on its left boundary. The upper and lower boundaries are shown parallel. Alternatively, the left boundary could be perpendicular to the light beams and the right boundary could be a ramp. In still another embodiment, both the right and left boundaries could be ramps. Again, the upper and lower boundaries, outside of the light beams need not be parallel. The important point is that the length of the light path within the prism 34 be different for different light beams, thereby producing different time-delays for the different beams. The shape of the prism cross-section, typically, is trapezoidal.

Figure 3:
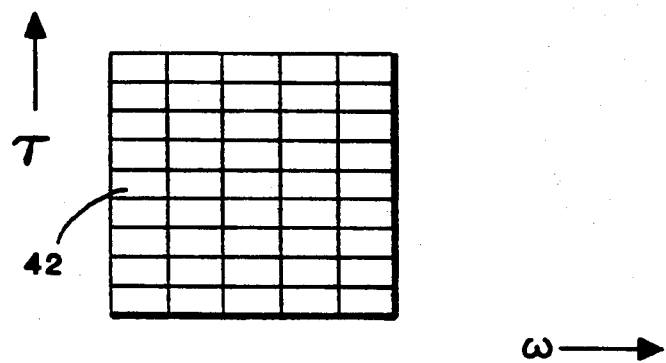
FIG. 3 is a schematic plan diagram of the detector matrix array of this invention.
Figure 4A:
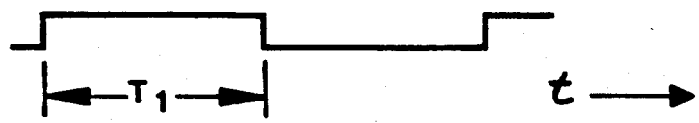
FIG. 4A is a graph in the time domain of a binary information signal, having a period of $2T_1$.
Figure 4B:
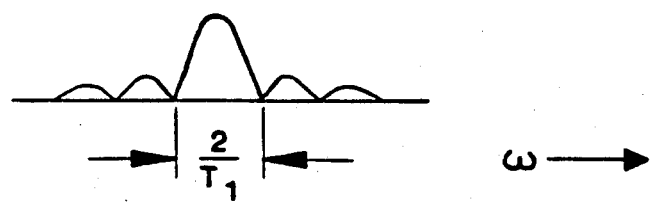
FIG. 4B is a graph in the frequency domain, w, corresponding to the signal of FIG. 4A.

FIG. 3 shows a two dimensional detector array 42. Certain misregistrations, which are proportional to the chip rate, are caused by the prism 34 and other optical components. These misregistrations result in a skewing of the outputs along the w axis of FIG. 2B at 42. This skewing is proportional to the chip rate and is accommodated by utilizing the two dimensional output detector array of FIG. 3. The detected output contains the same information, i.e. chipping frequency on both the $\tau$ axis of FIG. 2A and the w axis of FIG. 2B. The $\tau$ is controlled by the prism and is the desired output. The w axis information is incidental and is not controlled or predictable for precise chip rate frequency measurement.

Thus, the apparatus of this invention, by the position of various beams in the w dimension would specify the carrier frequencies of incoming signals, and by the position of various beams in the $\tau$ dimension would specify the period and hence the chip rate of the modulating pseudo-random signals.

The various detectors could be connected to an electronic apparatus (not shown) which would deliver frequency and chip rate information to a computer for further processing and display.

Although the invention has been described above, it is not intended that it should be limited by that description, but only according to the appended claims together with that description.

We claim:

1. An acousto-optic chip rate detector comprising:
   first and second Bragg cells, each having an optical axis defined thereon;
   first and second transducer means attached to said Bragg cells, respectively, for mechanically oscillating and delivering acoustic waves to said Bragg cells in a direction having a component perpendicular to said optical axes;
   means for delivering the same radio frequency signal to said first and second transducer means;
   means for producing a substantially uniform illumination field of coherent radiation;
   means for focussing said radiation onto said first Bragg cell in a direction having a component along said optical axis of said first Bragg cell;
   prism means in the path of radiation delivered from said first Bragg cell for variably time delaying different portions of said delivered radiation;
   means for focussing said delayed radiation onto said second Bragg cell; and
   a plurality of radiation sensors positioned to sense radiation from said second Bragg cell.

2. Apparatus as recited in claim 1 in which said radiation is visible light.

3. Apparatus as recited in claim 2 in which said prism means comprises a transparent body having different portions of said delivered light channeled through different thicknesses of said body.

4. Apparatus as recited in claim 3 in which said prism means comprises a light-transparent block having a trapezoidal cross-section.

5. An acousto-chip rate detector as recited in claim 3, in which:
   said prism means in the path of light delivered from said first Bragg cell has thickness dimension in the direction of said delivered light which varies as a function of position, such position being measured in a direction perpendicular to said thickness direction, for variably time delaying different portions, in the direction of variation of said thickness, of said delivered light.

6. An acousto-optic chip rate detector as recited in claim 5, in which:
   said means for focussing said delayed light onto said second Bragg cell focusses said delayed light in a direction having a component along said optical axis of said second Bragg cell.

7. An acousto-optic chip rate detector as recited in claim 6, in which:
   said plurality of radiation sensors are aligned and positioned to sense the positions of light from said second Bragg cell.

8. Apparatus as recited in claim 7 in which said transducer means are piezoelectric transducers.

9. Apparatus as recited in claim 8 in which said means for delivering the same radio frequency signal to said first and second transducers comprises a bandpass filter serially connected to a signal divider having two outputs which are connected to said transducers.

10. Apparatus as recited in claim 9 in which the optical axes of said Bragg cells are substantially aligned, said thickness dimension of said prism means is substantially in the direction of said optical axes, the direction of variation of said thickness of said prism means is substantially perpendicular to said optical axes, said acoustic waves are delivered to said Bragg cells substantially perpendicularly to their said optical axes and substantially parallel to the direction of said variation of thickness of said prism means, and in which said radiation sensors are aligned in a substantially planar rectangular array whose plane is substantially perpendicular to said optical axes and whose rows and columns are substantially parallel and substantially perpendicular, respectively, to the direction of said variation of thickness of said prism means.

* * * * *